(12) United States Patent
Park et al.

(10) Patent No.: US 11,500,609 B2
(45) Date of Patent: Nov. 15, 2022

(54) AUDIO SIGNAL CONTROL BASED ON NOISE ASSOCIATED WITH STATE INFORMATION RECEIVED FROM AN EXTERNAL DEVICE

(71) Applicant: SAMSUNG ELECTRONICS CO., LTD., Suwon-si (KR)

(72) Inventors: Byeol Park, Suwon-si (KR); Gohwoon Jeong, Suwon-si (KR); Sangshin Park, Suwon-si (KR); Changkun Park, Suwon-si (KR); Daewon Yoon, Suwon-si (KR); Heeran Lee, Suwon-si (KR); Namsu Ha, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 165 days.

(21) Appl. No.: 16/933,142

(22) Filed: Jul. 20, 2020

(65) Prior Publication Data
US 2021/0026592 A1    Jan. 28, 2021

(30) Foreign Application Priority Data

Jul. 23, 2019    (KR) .................. 10-2019-0088775

(51) Int. Cl.
*H03G 3/20*    (2006.01)
*G06F 3/16*    (2006.01)
*H03G 3/24*    (2006.01)

(52) U.S. Cl.
CPC ............ *G06F 3/165* (2013.01); *H03G 3/24* (2013.01)

(58) Field of Classification Search
CPC .................... G06F 3/165; H03G 3/24

USPC .......................................................... 381/57
See application file for complete search history.

(56) References Cited

U.S. PATENT DOCUMENTS

| 9,641,145 B2 | 5/2017 | Kim et al. |
| 9,677,814 B2 | 6/2017 | Giavani |
| 2006/0147059 A1* | 7/2006 | Tang ................... H04R 5/04 381/104 |
| 2010/0226499 A1* | 9/2010 | De Bruijn ............. H04S 7/303 381/17 |
| 2013/0165178 A1 | 6/2013 | Lee |

(Continued)

FOREIGN PATENT DOCUMENTS

| JP | 6099331 B2 | 3/2017 |
| JP | 6168451 B2 | 7/2017 |

(Continued)

OTHER PUBLICATIONS

Communication dated Oct. 27, 2020, issued by the International Searching Authority in counterpart International Application No. PCT/KR2020/009565 (PCT/ISA/210 and 237).

*Primary Examiner* — Katherine A Faley
(74) *Attorney, Agent, or Firm* — Sughrue Mion, PLLC

(57) ABSTRACT

A content reproducing electronic apparatus includes a communicator including circuitry, an audio output device, and a processor configured to receive state information indicating a state of an external electronic apparatus from the external electronic apparatus located around the electronic apparatus via the communicator, obtain noise information corresponding to the received state information, and control the audio output device to output an audio signal of a content based on a volume corresponding to the obtained noise information.

16 Claims, 14 Drawing Sheets

(56) References Cited

U.S. PATENT DOCUMENTS

| | | | |
|---|---|---|---|
| 2013/0315038 A1* | 11/2013 | Ferren | ............... G06F 3/0485 367/197 |
| 2018/0130454 A1 | 5/2018 | Liu | |
| 2018/0332417 A1 | 11/2018 | Hartung et al. | |
| 2019/0019513 A1 | 1/2019 | Kirihara | |
| 2019/0165750 A1 | 5/2019 | Goldman-Shenhar et al. | |

FOREIGN PATENT DOCUMENTS

| | | |
|---|---|---|
| JP | 2017-138476 A | 8/2017 |
| KR | 10-2005-0076959 A | 7/2005 |
| KR | 10-2012-0103928 A | 9/2012 |
| KR | 10-2015-0077101 A | 7/2015 |
| KR | 10-2016-0138726 A | 12/2016 |
| KR | 10-1866774 B1 | 6/2018 |

\* cited by examiner

FIG. 4

| STATE OF AIR PURIFIER | NOISE LEVEL (dB) |
|---|---|
| OFF | - |
| WEAK | 18 |
| MIDDLE | 25 |
| STRONG | 31 |

FIG. 6

| NOISE LEVEL (dB) | OPTIMAL VOLUME |
|---|---|
| ~ 0 | 2 |
| 0 ~ 10 | 4 |
| 10 ~ 20 | 6 |
| 20 ~ 30 | 8 |
| 30 ~ 40 | 10 |

FIG. 7

| STATE OF MOBILE PHONE | OPTIMAL VOLUME |
|---|---|
| ANSWERING | 4 |
| REPRODUCING MUSIC/IMAGE | 2 |
| ⋮ | ⋮ |

# AUDIO SIGNAL CONTROL BASED ON NOISE ASSOCIATED WITH STATE INFORMATION RECEIVED FROM AN EXTERNAL DEVICE

CROSS-REFERENCE TO RELATED APPLICATION(S)

This application is based on and claims priority under 35 U.S.C. § 119(a) to Korean Patent Application No. 10-2019-0088775, filed on Jul. 23, 2019, in the Korean Intellectual Property Office, the disclosure of which is incorporated by reference herein in its entirety.

BACKGROUND

1. Field

The disclosure relates to a content reproducing electronic apparatus. The disclosure more particularly relates to an electronic apparatus outputting an audio signal of a content at a volume based on a state of an external electronic apparatus located around the electronic apparatus.

2. Description of Related Art

In a related art content reproducing electronic apparatus, it might be difficult to effectively provide a sound of a content to a user, if an ambient noise is comparatively large.

In order to solve such a problem, an electronic apparatus including a microphone for measuring a noise and adjusting a volume of a voice of a content by considering the measured noise via the microphone has been developed.

However, in the related art electronic apparatus which does not include the microphone, it is difficult to execute automatic volume adjustment by considering the noise.

SUMMARY

Embodiments provide an electronic apparatus that is able to automatically adjust a volume of a voice of a content, without including a microphone in the apparatus, by considering a noise due to a state of neighboring apparatuses.

Embodiments provide an electronic apparatus that is able to effectively deal with noises generated by neighboring apparatuses by using state information of the neighboring apparatuses in an environment of Internet of Things (IoT) in which the electronic apparatus is able to communicate with one or more neighboring apparatuses.

Additional aspects will be set forth in part in the description which follows and, in part, will be apparent from the description, or may be learned by practice of the presented embodiments.

In accordance with an aspect of the disclosure, there is provided a content reproducing electronic apparatus including a communicator including circuitry, an audio output device, and a processor configured to receive state information indicating a state of an external electronic apparatus from the external electronic apparatus located around the electronic apparatus via the communicator, obtain noise information corresponding to the received state information, and control the audio output device to output an audio signal of a content based on a volume corresponding to the obtained noise information.

In accordance with an aspect of the disclosure, there is provided a method for controlling a content reproducing electronic apparatus, the method including receiving state information indicating a state of an external electronic apparatus from the external electronic apparatus located around the electronic apparatus via a communicator, obtaining noise information corresponding to the received state information, and outputting an audio signal of a content based on a volume corresponding to the obtained noise information.

BRIEF DESCRIPTION OF THE DRAWINGS

The above and other aspects, features, and advantages of certain embodiments of the present disclosure will be more apparent from the following description taken in conjunction with the accompanying drawings, in which:

FIG. 4 illustrates a table for explaining an example in which the electronic apparatus obtains predetermined noise information regarding state information of the external electronic apparatus;

FIG. 6 illustrates a table for explaining an example for identifying an optimal volume corresponding to the obtained noise information;

FIG. 7 illustrates a table for explaining an example in which the electronic apparatus identifies an optimal volume corresponding to state information of the external electronic apparatus;

DETAILED DESCRIPTION

Figure 1:
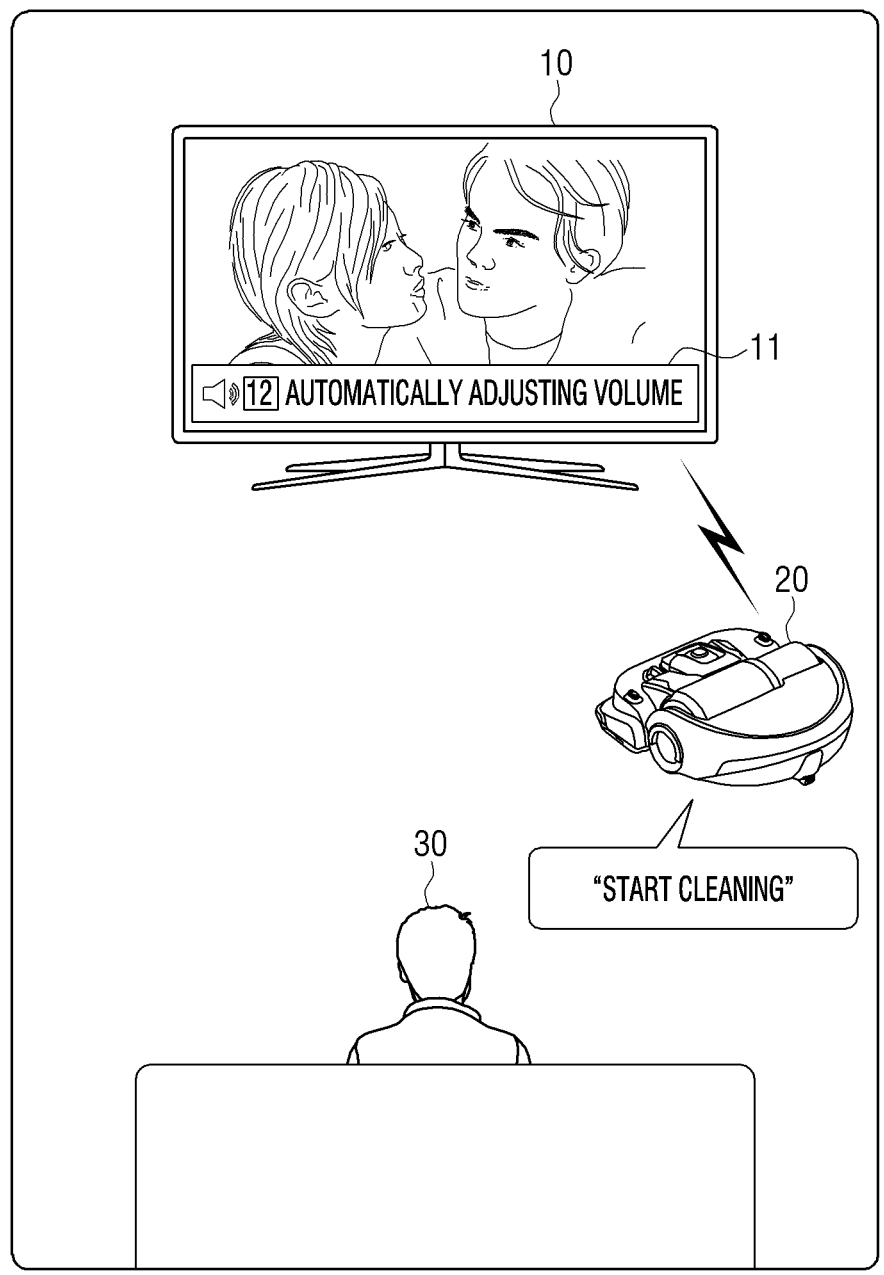
FIG. 1 illustrates a view for schematically explaining an example of an operation of an electronic apparatus.

The terms used herein are selected as general terms in consideration of functions in embodiments. But, these terms may vary in accordance with legal and technical interpretation, the emergence of new technologies and the like. In addition, some terms are arbitrarily selected by the applicant. Such terms may be interpreted as the meaning defined in this specification, and unless otherwise specifically defined, the terms may be interpreted based on general content of this specification and typical technical knowledge in the technical field.

In addition, the same reference numerals or symbols shown in the accompanying drawings of the specification show parts or elements executing substantially the same function. For convenience of description and understanding, the description will be made using the same reference numerals or symbols in different embodiments. That is, although all of elements having the same reference numeral are shown in a plurality of drawings, the plurality of drawings do not mean one embodiment.

In addition, terms including the ordinal umbers such as "first", "second", and the like may be used for distinguishing an element from another in the specification and claims. Such ordinal numbers are used for distinguishing the same or similar elements from each other and the meaning of the term should not be limitedly interpreted by using such ordinal numbers. For example, an element with such an ordinal number should not be limited in terms of a usage order or arrangement order due to the number thereof. If necessary, the ordinal numbers may be interchangeably used.

Unless otherwise defined specifically, a singular expression may encompass a plural expression. It is to be understood that the terms such as "comprise" or "consist of" are used herein to designate a presence of characteristic, number, step, operation, element, part, or a combination thereof, and not to preclude a presence or a possibility of adding one or more of other characteristics, numbers, steps, operations, elements, parts or a combination thereof.

A term such as "module", "unit", or "part" is a term indicating an element performing at least one function or operation, and such an element may be implemented as hardware, software, or a combination of hardware and software. Further, except for when each of a plurality of "modules", "units", "parts" and the like needs to be realized in an individual specific hardware, the components may be integrated as at least one module or chip and be implemented as at least one processor.

In addition, in embodiments, if it is described that a certain part is connected to another part, this includes not only direct connection but also indirect connection through still another medium. Further, the expression "a certain part includes another element" does not exclude other elements not disclosed, but means that other elements may be further included, unless otherwise noted.

FIG. 1 illustrates a view for schematically explaining an example of an operation of an electronic apparatus according to an embodiment.

Referring to FIG. 1, an electronic apparatus 10 implemented as a TV may execute communication with an external electronic apparatus 20 which is a robot cleaner located around the electronic apparatus 10. In addition, FIG. 1 shows a state in which the electronic apparatus 10 is reproducing a specific content and a user 30 is watching the content reproduced by the electronic apparatus 10.

Referring to FIG. 1, with a start of a cleaning operation of the external electronic apparatus 20, the electronic apparatus 10 may receive information indicating the start of the cleaning from the external electronic apparatus 20 and determine a noise level (decibel (dB)) expected to be generated according to the start of the cleaning of the external electronic apparatus 20.

The electronic apparatus 10 may automatically increase a volume of an audio signal of an output content by considering the determined noise level.

As a result, a user can clearly hear the sound of the content, although a noise is generated due to the cleaning executed by the external electronic apparatus 20.

Referring to FIG. 1, the electronic apparatus 10 may display a graphic user interface (GUI) 11 informing that the volume is automatically being adjusted.

Figure 2:
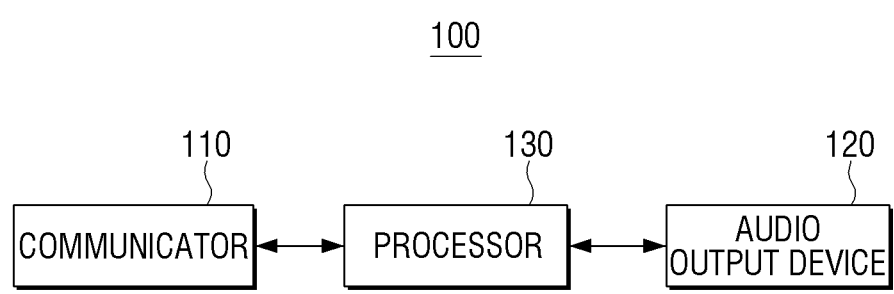
FIG. 2 illustrates a block diagram for explaining a configuration of the electronic apparatus according to an embodiment.

FIG. 2 illustrates a block diagram for explaining a configuration of a content reproducing electronic apparatus according to an embodiment.

Referring to FIG. 2, an electronic apparatus 100 may include a communicator 110, an audio output device 120, and a processor 130.

The electronic apparatus 100 may be implemented as a TV, a desk-top PC, a laptop PC, a tablet PC, a laptop, a smartphone, a speaker device, a wireless earphone, a beam projector, or the like and may also be implemented as various apparatuses capable of outputting audio signals.

In addition, the electronic apparatus 100 may also be implemented as a remote control, a smartphone, a set-top box, a server or the like that is connected to at least one audio output device and controls a volume of an audio signal outputted by the connected audio output device.

The communicator 110 is a component for transmitting and receiving signals and data by executing communication with at least one external electronic apparatus by the electronic apparatus 100. For this, the communicator 110 may include circuitry.

The communicator 110 may include a wireless communication module, a wired communication module, a broadcast receiver module, and the like.

The wireless communication module may include at least one of a Wi-Fi communication module, a Bluetooth module, an infrared communication (infrared data association (IrDA)) module, a 3rd generation (3G) mobile communication module, a 4th generation (4G) mobile communication module, a 4th generation long term evolution (LTE) communication module, and 5th generation (5G) communication module, in order to receive contents from an external server or an external apparatus.

The wired communication module may include an interface module such as a USB. The wired communication module may be physically connected to an external terminal apparatus such as a PC via such an interface module and may transmit and receive sounds or image data or transmit and receive firmware data for executing firmware update.

In addition, the wired communication module may be implemented as a port such as HDMI port, a display port, an RGB port, a digital visual interface (DVI) port, a Thunderbolt port, a component port, and the like.

The broadcast receiver module may receive a signal regarding a broadcast content. The broadcast content may include a video, a sound, and additional data (e.g., EPG), and the broadcast receiver module may receive a broadcast content signal from various sources such as terrestrial broadcasting, cable broadcasting, satellite broadcasting, internet broadcasting, and the like.

The broadcast receiver module may be implemented in a form including a component such as a tuner, a demodulator, an equalizer, or the like, in order to receive the broadcast content transmitted from a broadcasting station.

The audio output device 120 is a component for outputting an audio signal. The audio output device 120 may include a speaker and/or a headphone/earphone output terminal.

The processor 130 is connected to the communicator 110 and the audio output device 120 and controls general operations of the electronic apparatus 100.

For this, the processor 130 may include a random access memory (RAM), a read only memory (ROM), a central processing unit (CPU), a graphic processing unit (GPU), and a system bus, and may execute operations regarding the control of other components included in the electronic apparatus 100 or data processing.

The processor 130 according to an embodiment may receive state information indicating a state of an external electronic apparatus from the external electronic apparatus located around the electronic apparatus 100 via the communicator 110.

In such a case, the processor 130 may transmit a request for the state information to the external electronic apparatus and receive the state information in response to the request from the external electronic apparatus via the communicator 110. In addition, the processor 130 may also periodically or aperiodically receive the state information from the external electronic apparatus via the communicator 110. Further, the external electronic apparatus may transmit the state information of the external electronic apparatus to the communicator 110 of the electronic apparatus 100, when the state of the external electronic apparatus is changed.

The processor 130 may receive the state information via a Bluetooth module from an external electronic apparatus that is located around the electronic apparatus 100 so as to be connected via the Bluetooth module of the communicator 110.

In addition, in a state where the electronic apparatus 100 and one or more external electronic apparatuses are connected to a server by a communication system of Wi-Fi, 4G, or 5G, the processor 130 may receive state information indicating a state of the external electronic apparatus that is registered in the server in advance as an external electronic apparatus located around the electronic apparatus 100 or located in the same zone as the electronic apparatus 100, from the server.

In such a case, the electronic apparatus 100 may receive the state information of each of a first external electronic apparatus and a second external electronic apparatus located in the same zone (living room) as the electronic apparatus 100 from the server.

Figure 3:
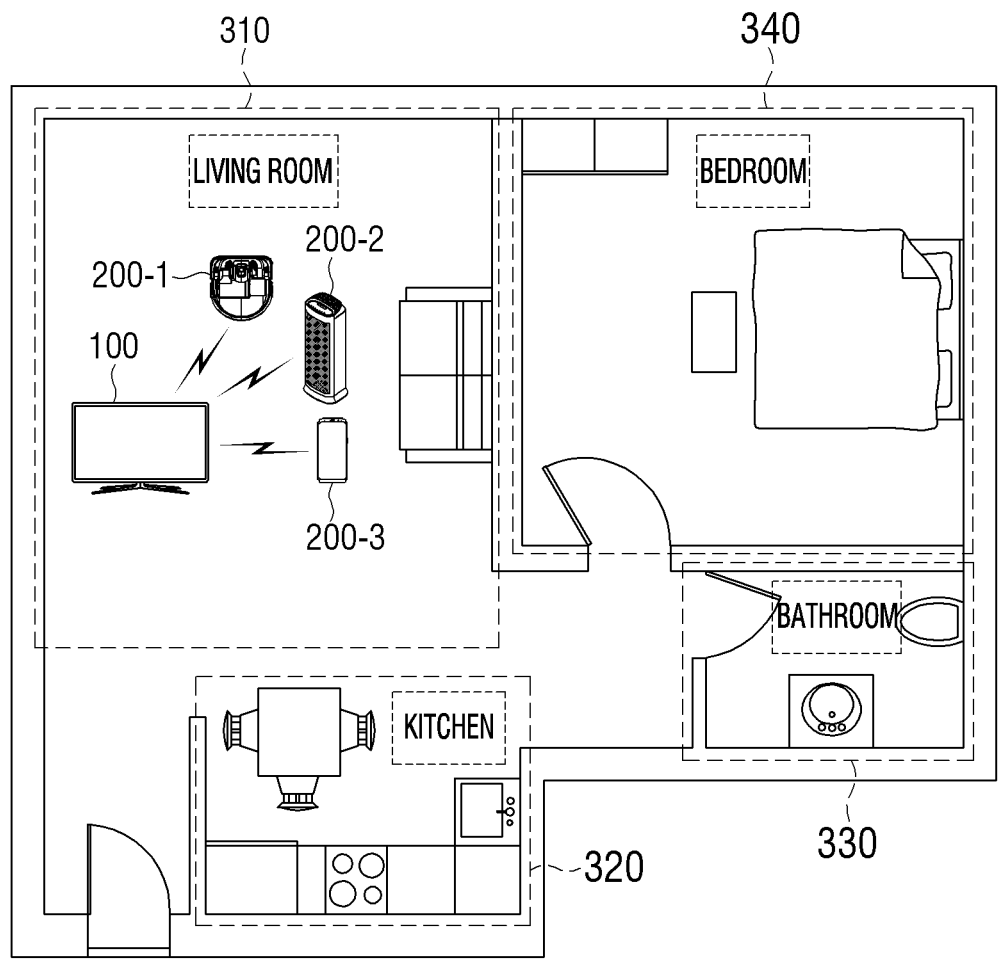
FIG. 3 illustrates a view for explaining an operation of the electronic apparatus executing communication with a plurality of external electronic apparatuses located around the electronic apparatus according to an embodiment.

In regard to this, FIG. 3 illustrates a view for explaining an operation of the electronic apparatus executing communication with a plurality of external electronic apparatuses located around the electronic apparatus according to an embodiment.

Referring to FIG. 3, it is assumed that the IoT environment is formed in which a plurality of apparatuses located in a certain house including the electronic apparatus 100 which is a TV are directly or indirectly connected to each other. In addition, it is assumed that the electronic apparatus 100, a robot cleaner 200-1, an air purifier 200-2, and a mobile phone 200-3 are currently registered in an IoT server as being located in a living room 310 among zones 310, 320, 330, and 340 in the house.

In such a case, the electronic apparatus 100 may receive state information of each of the external electronic apparatuses 200-1, 200-2, and 200-3 directly from the external electronic apparatuses 200-1, 200-2, and 200-3 or via the server.

The state information is information indicating a state of the external electronic apparatus, and may include information regarding a power on/off state of the external electronic apparatus, an operation mode of the external electronic apparatus, a location where the external electronic apparatus is currently operating, or the like.

For example, the state information of the robot cleaner 200-1 may indicate in which state the robot cleaner 200-1 is, among various states such as a state where the robot cleaner 200-1 is turned off, a state where the cleaning is being executed in a normal mode, a state where the cleaning is being executed in an acceleration mode in which suction power and a movement speed are increased to maximum levels, and the like. In addition, the state information of the robot cleaner 200-1 may include information regarding a location where the robot cleaner 200-1 is currently operating, a distance between the robot cleaner 200-1 and the electronic apparatus 100, and the like.

For example, the state information of the air purifier 200-2 may indicate in which state the air purifier 200-2 is, among various states such as a "weak" operation mode, a "middle" operation mode, a "strong" operation mode, a dehumidification mode, and the like.

For example, the state information of the mobile phone 200-3 may indicate in which state the mobile phone 200-3 is, among various states such as a state where the mobile phone 200-3 is ringing or answering, a state where an image or music is reproduced by the mobile phone 200-3, a state where an image is being captured by the mobile phone 200-3, and the like.

However, the external electronic apparatuses and the examples of the state information indicating the states thereof are not limited to the examples described above, and the embodiment may be realized for various cases which may be included in the noise information to be considered for determining an optimal volume of the electronic apparatus 100.

The processor 130 may obtain noise information corresponding to the state information received from the external electronic apparatus.

The noise information may include information regarding various properties of the noise such as a level of the noise (e.g., decibel (dB)), a frequency of the noise, and the like.

The processor 130 may determine whether or not the state of the external electronic apparatus is changed based on the received state information. If it is determined that the state of the external electronic apparatus is changed, the processor 130 may obtain the noise information based on the state information corresponding to the changed state.

Specifically, the processor 130 may obtain the noise information corresponding to the changed state from noise information predetermined for each state of the external electronic apparatus.

In regard to this, FIG. 4 illustrates a table for explaining an example in which the electronic apparatus obtains predetermined noise information regarding the received state information.

FIG. 4 illustrates noise information predetermined for each state of the air purifier 200-2, specifically, information regarding a noise level (decibel (dB)) predetermined for each state of the air purifier 200-2.

For example, the processor 130 may determine that the state of the air purifier 2002 is changed from a "weak" operation mode to a "middle" operation mode according to the state information received from the air purifier 200-2.

In such a case, the processor 130 may obtain a noise level, 25 (dB), predetermined for the "middle" operation mode, which is the changed state, according to the information shown in FIG. 4.

The processor 130 may obtain noise information through an audio signal detected by a microphone included in the electronic apparatus 100 or the external electronic apparatus.

In such a case, the processor 130 may determine whether or not the external electronic apparatus including the microphone is present around the electronic apparatus 100 by using the communicator 110. The external electronic apparatus including the microphone may be various apparatuses such as a remote control, a smartphone, an external speaker, and the like.

Specifically, a list of one or more external electronic apparatuses each including a microphone may be stored in the electronic apparatus 100 in advance.

If the external electronic apparatus located around the electronic apparatus 100 and connected by Bluetooth, Wi-Fi, or other systems via the communicator 110 is determined to be included in the list stored in advance, the processor 130 may receive data regarding an audio signal detected by the microphone of the external electronic apparatus via the communicator 110.

In addition, the processor 130 may obtain noise information using the audio signal corresponding to the received data. Specifically, the processor 130 may obtain noise information by using information regarding various properties such as a size (level), a frequency, and the like of the detected audio signal included in the received data.

However, the audio signal corresponding to the received data may also include an audio signal of a content that is currently being output via the audio output device 120 of the electronic apparatus 100, and accordingly, the processor 130 may obtain noise information based on the audio signal excluding the audio signal of the content that is being output from the audio signals corresponding to the received data.

Figure 5:
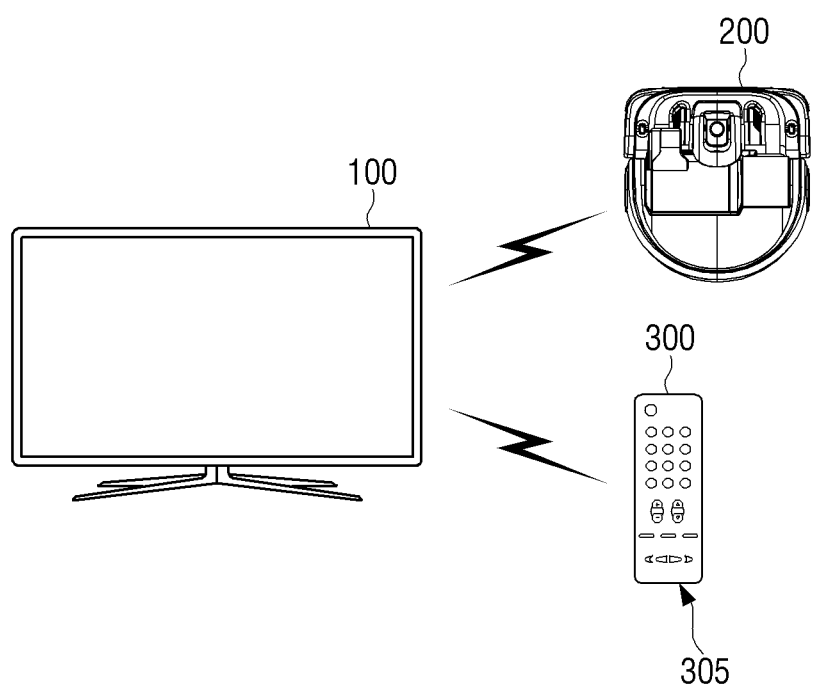
FIG. 5 illustrates a view for explaining an example in which the electronic apparatus obtains noise information via communication with the external electronic apparatus including a microphone.

FIG. 5 illustrates a view for explaining an example in which the electronic apparatus obtains noise information via communication with the external electronic apparatus including a microphone.

Referring to FIG. 5, the electronic apparatus 100 which is a TV may receive state information of a robot cleaner 200 via the communicator 110. If it is determined that the state of the robot cleaner 200 is changed from a power off state to a state of executing the cleaning in a normal mode according to the received state information, the processor 130 may determine whether or not an external electronic apparatus including a microphone is present around the electronic apparatus.

Referring to FIG. 5, the processor 130 may be connected to a remote control 300 via Bluetooth communication using the communicator 110. The processor 130 may determine that the remote control 300 is an apparatus including a microphone 305 by using identification information or product information of the remote control 300 received from the remote control 300.

In such a case, the processor 130 may receive data regarding an audio signal detected by the microphone 305 from the remote control 300 via the communicator 110.

The processor 130 may obtain ambient noise information by using the audio signal corresponding to the data received from the remote control 300.

If it is determined that there is no external electronic apparatus including a microphone around the electronic apparatus 100, the processor 130 may obtain noise information corresponding to the changed state among noise information predetermined for each state of the external electronic apparatus as shown in FIG. 4.

The processor 130 may identify a volume corresponding to noise information obtained by at least one of the above embodiments. The volume may be defined with various standards or scales according to audio output features of the audio output device 120 of the electronic apparatus 100. Loudness, K-weighted, relative to full scale (LKFS) is an example of the volume (sound level) standard but the volume might not be defined by only this standard, in an embodiment.

The processor 130 may identify a volume corresponding to the obtained noise information among volume predetermined for each noise information.

In regard to this, FIG. 6 illustrates a table for explaining an example in which the electronic apparatus identifies an optimal volume corresponding to the obtained noise information. FIG. 6 illustrates information regarding the optimal volume predetermined for each noise level included in noise information.

For example, if the state of the air purifier 200-2 of FIG. 3 is changed to the "strong" operation mode, the processor 130 may identify the noise level as 31 dB through the information of FIG. 4 and identify the optimal volume predetermined for 31 dB as "10" through the information of FIG. 6.

The processor 130 may determine whether or not there is a volume setting history of a user corresponding to the state of the external electronic apparatus based on the received state information.

The volume setting history corresponds to a history in which volumes of audio signals of the contents output by the audio output device 120 are set by a user command. The user command herein may be received from an apparatus for controlling the electronic apparatus 100 such as a remote control, or a smartphone or a set-top box installed with a remote control application, via the communicator 110. In addition, the user command may be input via a user input device or a user input unit 150 of the electronic apparatus 100 (see FIG. 9).

If it is determined that there is a volume setting history corresponding to the state of the external electronic apparatus according to the received state information, the processor 130 may identify an (optimal) volume according to the volume setting history.

Specifically, the processor 130 may identify a volume finally set by a user when the external electronic apparatus was in a state corresponding to the obtained state information in the past, based on the volume setting history.

For example, it may be assumed that a history, in which the volume is set to "11" by the volume setting of a user when the robot cleaner 200-1 of FIG. 3 executes the cleaning in the normal mode, is stored in the electronic apparatus 100 in advance. If the state of the robot cleaner 200-1 is changed again to the state of executing the cleaning in the normal mode later, the processor 130 may identify the optimal volume corresponding to the received state information as "11".

The above example is an embodiment of the volume setting history corresponding to the state of the external electronic apparatus according to the received state information, but the volume setting history corresponding to the noise level according to the obtained noise information may be used.

For example, a history, in which the volume is set to "5" by the volume setting of a user in a state where the noise level of the obtained noise information is 5 dB, may be assumed. If the noise information corresponding to the noise level of 5 dB is obtained again later, the processor 130 may identify the optimal volume corresponding to the obtained noise information as "5".

If it is determined that there is no volume setting history corresponding to the state of the external electronic apparatus according to the received state information, the processor 130 may identify the volume corresponding to the obtained noise information among the volumes predetermined for each noise information as shown in FIG. 6.

The processor 130 may directly identify the optimal volume by using the volume predetermined for the state of the external electronic apparatus corresponding to the received state information.

Specifically, the processor 130 may identify a volume predetermined for the obtained state information among the volumes predetermined for each state information.

In regard to this, FIG. 7 illustrates a table for explaining an example in which the electronic apparatus identifies an optimal volume corresponding to the state of the external electronic apparatus. FIG. 7 shows information regarding the optimal volume predetermined for each state of the mobile phone 200-3 of FIG. 3.

Referring to FIG. 7, if the state of the mobile phone 200-3 is determined as "answering" by using the state information received from the mobile phone 200-3, the processor 130 may identify the optimal volume as "4" through the information of FIG. 7. In such a case, the process in which the processor 130 obtains the noise information corresponding to the received state information may be omitted.

The processor 130 may control the audio output device 120 to output an audio signal of a content based on the volume identified through the above embodiments. The audio output device 120 may output the audio signal of the content with the identified volume.

Specifically, if the identified volume is higher than the volume of the audio signal of the content output by the audio output device 120, the processor 130 may control the audio output device 120 to increase the volume of the audio signal of the output content, and if the identified volume is lower than the volume of the audio signal of the content output by the audio output device 120, the processor 130 may control the audio output device 120 to decrease the volume of the audio signal of the output content.

If the identified volume is the same as the volume of the audio signal of the output content, the processor 130 has no need to control the audio output device 120 to adjust the volume of the audio signal of the output content.

If the identified volume is higher than the volume of the audio signal of the content output by the audio output device 120, the processor 130 may extract an audio signal corresponding to a voice of an utterer among audio signals of the content.

For example, the processor 130 may extract an audio signal having a feature of a human voice among the audio signals of the content by a speech recognition model. The speech recognition model may be obtained by modelling one or more parameters indicating the feature of the human voice, and the feature of the voice may be a pitch, a formant, a linear predictive cepstral coefficient (LPCC), a Mel-frequency cepstral coefficient (MFCC), perceptual linear predictive (PLP), but is not limited thereto.

The processor 130 may control the audio output device 120 to increase the volume of the audio signal extracted from the audio signals of the output content.

In such a case, the voice of the utterer may be more clearly heard by a user, compared to a case of simply increasing all of the audio signals of the output content.

The processor 130 according to an embodiment may execute at least some of various operations described above by controlling one or more software modules designed to execute operations different from each other.

Figure 8:
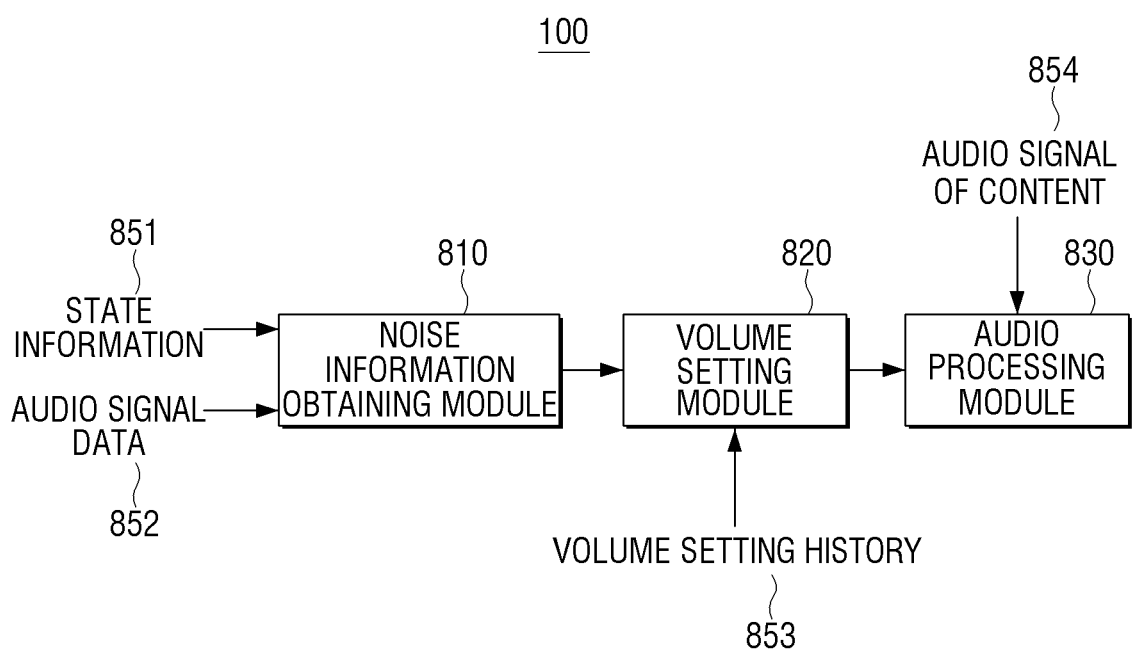
FIG. 8 illustrates a block diagram for explaining a software configuration of the electronic apparatus according to an embodiment.

FIG. 8 illustrates a block diagram for explaining a software configuration of the electronic apparatus according to an embodiment.

Referring to FIG. 8, the electronic apparatus 100 may include a noise information obtaining module 810, a volume setting module 820, and an audio processing module 830.

The processor 130 may obtain ambient noise information of the electronic apparatus 100 by the noise information obtaining module 810.

Specifically, the noise information obtaining module 810 may obtain noise information by using the state information 851 received from the external electronic apparatus. In addition, the noise information obtaining module 810 may obtain noise information by using data 852 regarding the audio signal detected by a microphone received from the external electronic apparatus including the microphone.

The processor 130 may identify the optimal volume by the volume setting module 820.

Specifically, the volume setting module 820 may identify the volume predetermined for the noise information obtained by the noise information obtaining module 810. In addition, the volume setting module 820 may identify the optimal volume by using a volume setting history 853 of a user corresponding to the received state information or the obtained noise information.

The processor 130 may change the volume of an audio signal 854 of the content to the identified volume by the audio processing module 830. For this, the audio processing module 830 may combine with at least some circuits to form an amplifier or a converter.

Figure 9:
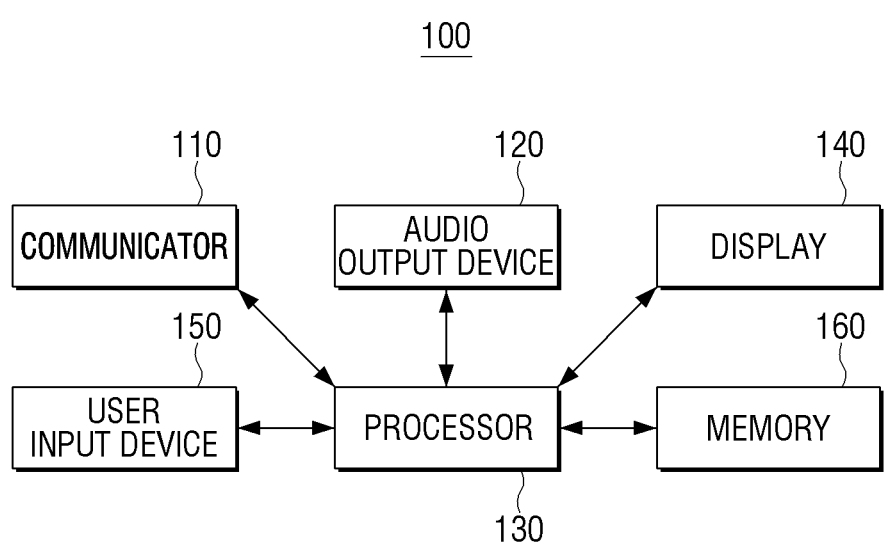
FIG. 9 illustrates a block diagram for explaining a detailed configuration of the electronic apparatus according to an embodiment.

FIG. 9 illustrates a block diagram for explaining a detailed configuration of the electronic apparatus according to an embodiment.

Referring to FIG. 9, the electronic apparatus 100 may include a display 140, a user input device 150, a memory 160, and the like, in addition to the communicator 110, the audio output device 120, and the processor 130.

The display 140 may be implemented as a liquid crystal display (LCD), a plasma display panel (PDP), an organic light emitting diode (OLED), a transparent OLED (TOLED), a micro LED as a component for displaying an image, a graphic user interface (GUI), and the like of a content provided by the electronic apparatus 100.

The display 140 may be implemented in a form of a touch screen that is able to detect a touch of a user or may also be implemented as a flexible display that may be folded or bent.

The processor 130 may control the display 140 to display a GUI informing the automatic adjustment of the volume as shown in FIG. 1, when automatically adjusting the volume of the audio signal of the content output by the audio output device 120 as in the above embodiments.

The user input device 150 is a component that enables the electronic apparatus 100 to receive a command or information from a user.

The processor 130 may control the audio output device 120 to output the audio signal of the content at a volume according to a user command, when the user command for adjusting the volume of the audio signal of the content output by the audio output device 120 is received via the user input device 150.

The user input device 150 may include a touch panel implemented with the display 140 or a separate touch pad in order to receive a user command or information by touching.

The user input device 150 may include a microphone for receiving a user command or information as a voice. The processor 130 may obtain ambient noise information by using the audio signal detected by the microphone included in the user input device 150.

The user input device 150 may include one or more buttons, a keyboard, or a mouse (all not shown) for receiving information from a user.

The memory 160 is a component for storing the operating system (OS) for controlling the general operations of the components of the electronic apparatus 100 and at least one instruction or data related to the components of the electronic apparatus 100. The processor 130 may execute operations according to the above embodiments by executing the at least one instruction stored in the memory 160.

For this, the memory 160 may be implemented as a non-volatile memory (e.g., a hard disk, a solid state drive (SSD), a flash memory), or a volatile memory.

The memory 160 may store the noise information predetermined for each state information of the external electronic apparatus (e.g., FIG. 4), the information regarding the (optimal) volume predetermined for each noise information (e.g., FIG. 6), the information regarding the volume predetermined for each state information of the external electronic apparatus (e.g., FIG. 7), and the like.

In addition, the memory 160 may store the volume setting history of a user according to the state information or the noise information of the external electronic apparatus.

If the electronic apparatus 100 is implemented as a set-top box or a server, the electronic apparatus 100 might not include the audio output device for outputting the audio signal of the content.

In such a case, the electronic apparatus 100 may identify the optimal volume by using the state of the external electronic apparatus according to the received state information and/or the obtained noise information. The electronic apparatus 100 may transmit the information regarding the identified volume to an external electronic apparatus such as a TV connected via the communicator 110. Accordingly, the audio signal of the content may be output at the identified volume through the TV connected to the electronic apparatus 100.

Figure 10:
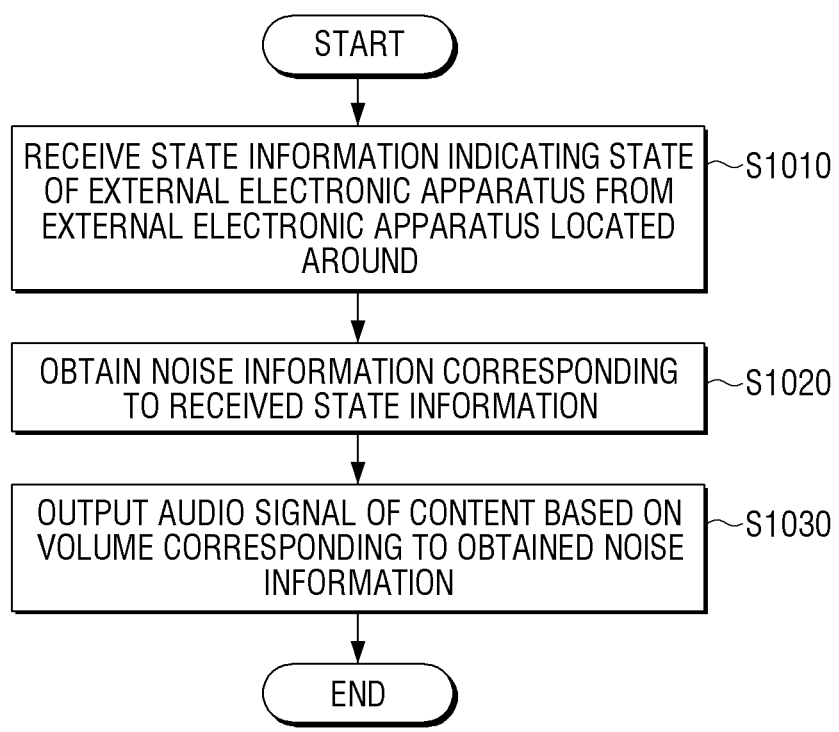
FIG. 10 illustrates a flowchart for explaining a method for controlling the electronic apparatus according to an embodiment.

FIG. 10 illustrates a flowchart for explaining a method for controlling the electronic apparatus reproducing a content according to an embodiment.

Referring to FIG. 10, the control method may include receiving state information indicating a state of an external electronic apparatus from the external electronic apparatus located around the electronic apparatus via a communicator (S1010). In such a case, the state information may be received from the external electronic apparatus connected by the Bluetooth communication. In addition, the state information may be received from an external electronic apparatus that is registered in the server to be located around the electronic apparatus or located in the same zone as the electronic apparatus by the communication of Wi-Fi, 4G, or 5G.

Noise information corresponding to the received state information may be obtained (S1020). It may be determined whether or not the state of the external electronic apparatus is changed based on the received state information, and if it is determined that the state of the external electronic apparatus is changed, the noise information may be obtained based on the state information corresponding to the changed state.

In such a case, the noise information corresponding to the changed state among the noise information predetermined for each state of the external electronic apparatus may be obtained.

In S1020, it may be determined whether or not there is an external electronic apparatus including a microphone around the electronic apparatus by using the communicator.

If it is determined that there is the external electronic apparatus including the microphone around the electronic apparatus, data regarding an audio signal detected by the microphone by the external electronic apparatus including the microphone may be received via the communicator and the noise information may be obtained based on the received data.

In such a case, the noise information may be obtained based on an audio signal excluding an audio signal of a content among the audio signals corresponding to the received data.

On the other hand, if it is determined that there is no external electronic apparatus including the microphone around the electronic apparatus, the noise information corresponding to the changed state among the noise information predetermined for each state of the external electronic apparatus may be obtained.

The control method may include outputting an audio signal of the content based on a volume corresponding to the obtained noise information (S1030). In such a case, the audio signal of the content may be output based on the volume corresponding to the obtained noise information among volumes predetermined for each noise information.

In Step S1030, it may be determined whether or not there is a volume setting history of a user corresponding to a state of the external electronic apparatus based on the received state information.

If it is determined that there is the volume setting history corresponding to the state of the external electronic apparatus according to the received state information, an audio signal of the content may be output at a volume according to the volume setting history.

In such a case, a volume finally set by a user while the external electronic apparatus is in the state in the past may be identified based on the volume setting history, and the audio signal of the content may be output at the identified volume.

If it is determined that there is no volume setting history corresponding to the state of the external electronic apparatus according to the received state information, the audio signal of the content may be output based on a volume corresponding to the obtained noise information among volumes predetermined for each noise information.

In the control method, if the volume corresponding to the obtained noise information is higher than the volume of the audio signal of the content output by the electronic apparatus, the volume of the audio signal of the output content may be increased, and if the volume corresponding to the obtained noise information is lower than the volume of the audio signal of the content output by the electronic apparatus, the volume of the audio signal of the output content may be decreased.

In particular, if the volume corresponding to the obtained noise information is higher than the volume of the audio signal of the content output by the electronic apparatus, an audio signal corresponding to a voice of an utterer may be extracted among audio signals of the content, and a volume of the audio signal extracted among the audio signals of the output content may be increased.

Figure 11:
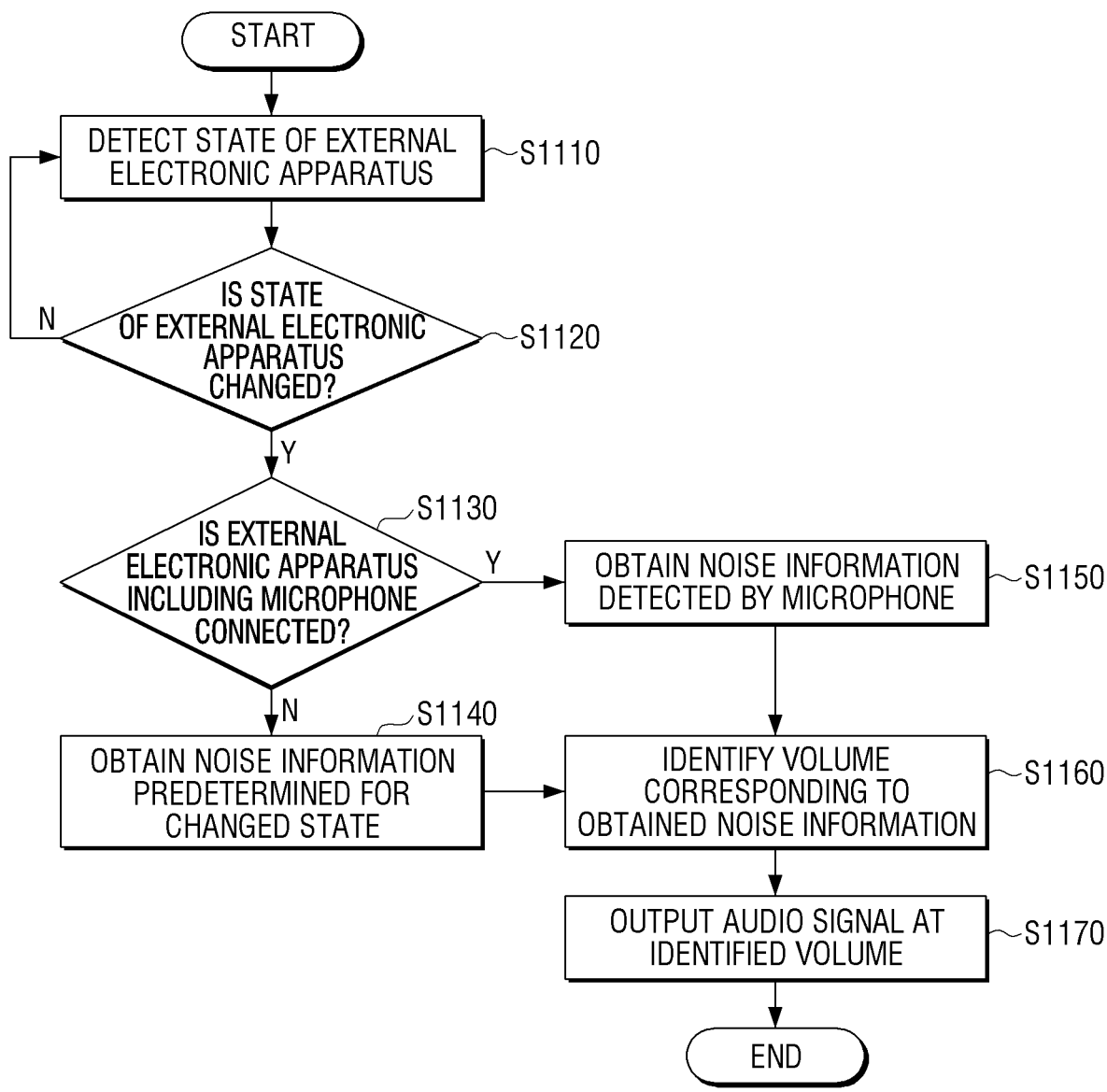
FIG. 11 illustrates an algorithm for explaining a process of obtaining noise information via communication with the external electronic apparatus including the microphone in the method for controlling the electronic apparatus according to an embodiment.

FIG. 11 illustrates an algorithm for explaining a process of obtaining noise information via communication with the external electronic apparatus including the microphone in the method for controlling the electronic apparatus according to an embodiment.

Referring to FIG. 11, the control method may include detecting a state of an external electronic apparatus by using state information received from the external electronic apparatus (S1110). If the state of the external electronic apparatus is changed (S1120-Y), it may be determined whether or not an external electronic apparatus including a microphone is connected to the electronic apparatus (S1130).

If the external electronic apparatus including the microphone is not connected to the electronic apparatus (S1130-N), noise information predetermined for the changed state may be obtained (S1140).

If the external electronic apparatus including the microphone is connected to the electronic apparatus (S1130-Y), noise information may be obtained by receiving data regarding an audio signal detected by the microphone from the external electronic apparatus including the microphone (S1150).

A volume corresponding to the obtained noise information may be identified (S1160). Specifically, a volume predetermined for the obtained noise information among the volumes predetermined for each noise information may be identified.

An audio signal of a content may be output at the identified volume (S1170).

Figure 12A:
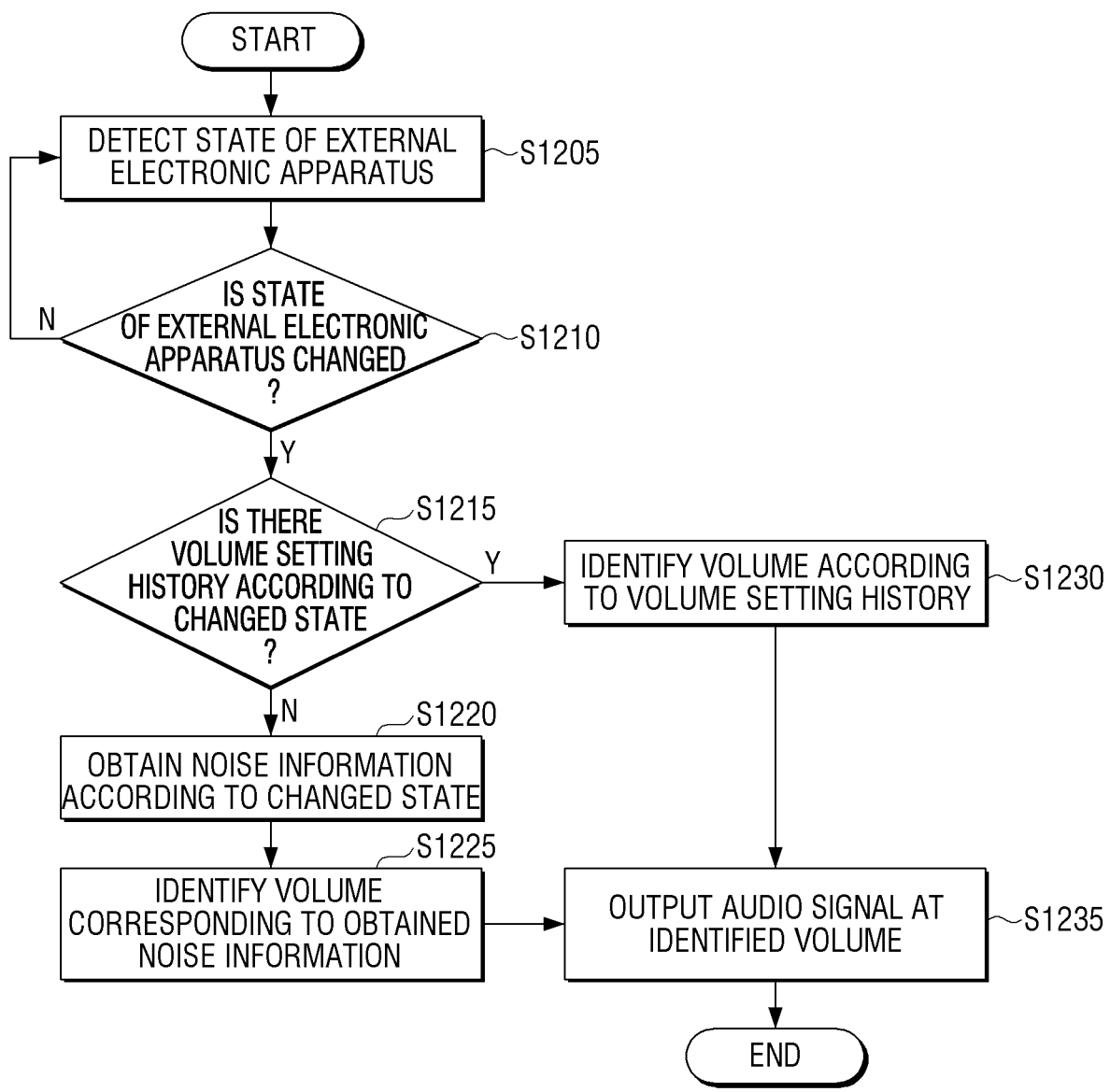
FIG. 12A illustrates an algorithm for explaining an example for identifying an optimal volume according to a volume setting history regarding a state of the external electronic apparatus in the control method according to an embodiment.

FIG. 12A illustrates an algorithm for explaining an example for identifying an optimal volume according to a volume setting history regarding a state of the external electronic apparatus in the control method according to an embodiment.

Referring to FIG. 12A, in the control method, a state of the external electronic apparatus is detected through state information received from the external electronic apparatus (S1205), and if it is determined that the state of the external electronic apparatus is changed (S1210-Y), it may be determined whether or not there is a volume setting history according to the changed state (S1215). Specifically, it may be determined whether or not there is a history in which a volume is set by a user while the external electronic apparatus is in the changed state described above in the past.

If there is a volume setting history according to the changed state (S1215-Y), the volume according to the volume setting history may be identified (S1230). Specifically, a volume finally set by a user when the external electronic apparatus was in the changed state described above in the past, may be identified by using the volume setting history.

On the other hand, if there is no volume setting history according to the changed state (S1215-N), the noise information according to the changed state may be obtained (S1220). Specifically, the noise information predetermined for the changed state among the noise information predetermined for each state of the external electronic apparatus may be obtained.

In such a case, a volume corresponding to the obtained noise information may be identified (S1225). Specifically, a volume predetermined for the obtained noise information may be identified among volumes predetermined for each noise information.

In the control method, an audio signal of the content may be output at the identified volume (S1235).

Figure 12B:
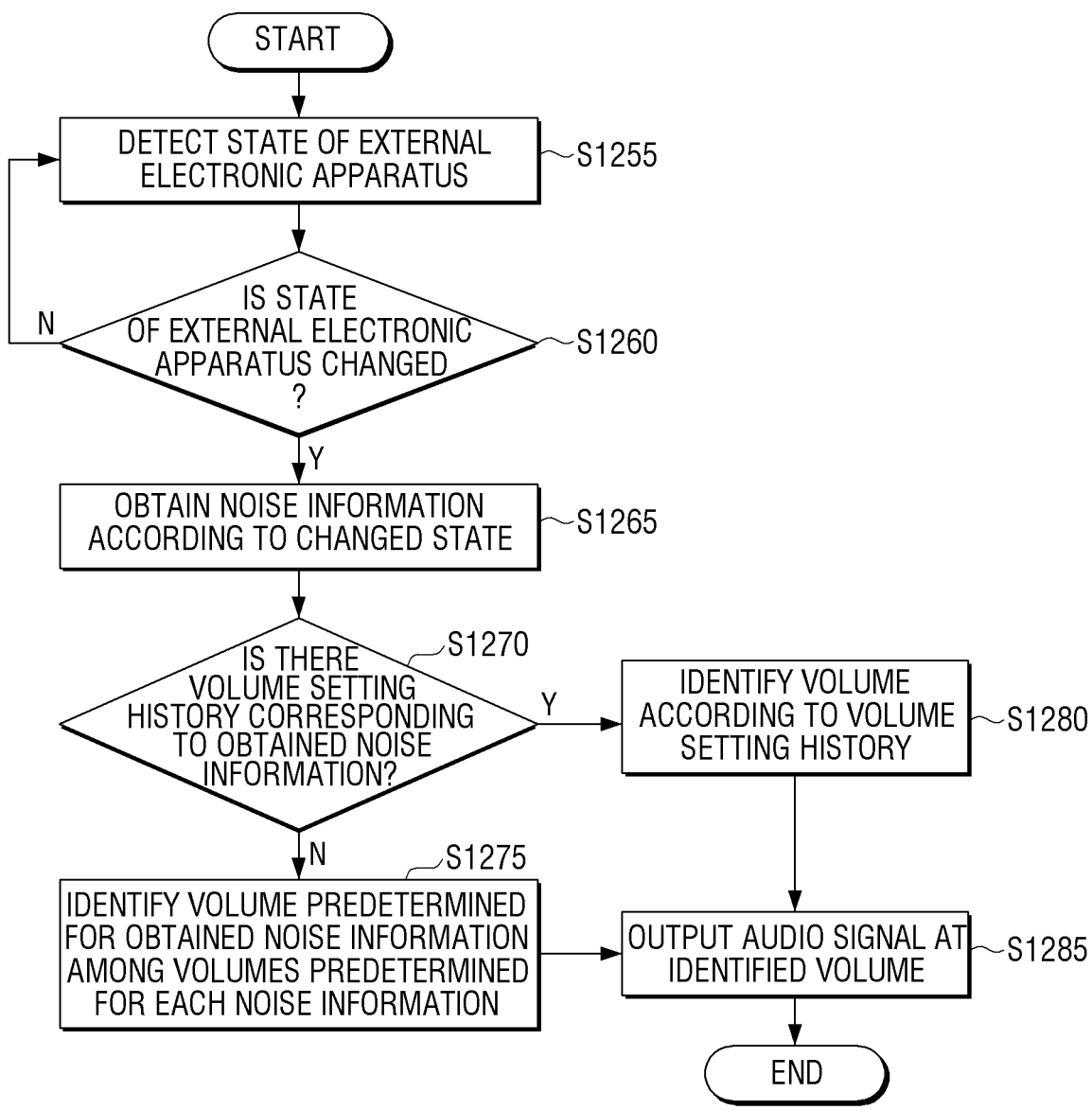
FIG. 12B illustrates an algorithm for explaining an example for identifying an optimal volume according to a volume setting history regarding noise information in the control method according to an embodiment.

FIG. 12B illustrates an algorithm for explaining an example for identifying an optimal volume according to the volume setting history regarding the noise information in the control method according to an embodiment.

Referring to FIG. 12B, in the control method, a state of the external electronic apparatus is detected through state information received from the external electronic apparatus (S1255), and if it is determined that the state of the external electronic apparatus is changed (S1260-Y), noise information according to the changed state may be obtained (S1265).

Then, it may be determined whether or not there is a volume setting history according to the obtained noise information (S1270). Specifically, it may be determined whether or not a history, in which a volume is set by a user when the above noise information is obtained in the past, is stored in advance.

If there is a volume setting history corresponding to the obtained noise information (S1270-Y), a volume according to the volume setting history may be identified (S1280). Specifically, a volume finally set by a user when the above noise information is obtained in the past, may be identified by using the volume setting history.

On the other hand, if there is no volume setting history corresponding to the obtained noise information (S1270-N), the volume predetermined for the obtained noise information may be identified among volumes predetermined for each noise information (S1275).

In the control method, the audio signal of the content may be output at the identified volume (S1285).

Figure 13:
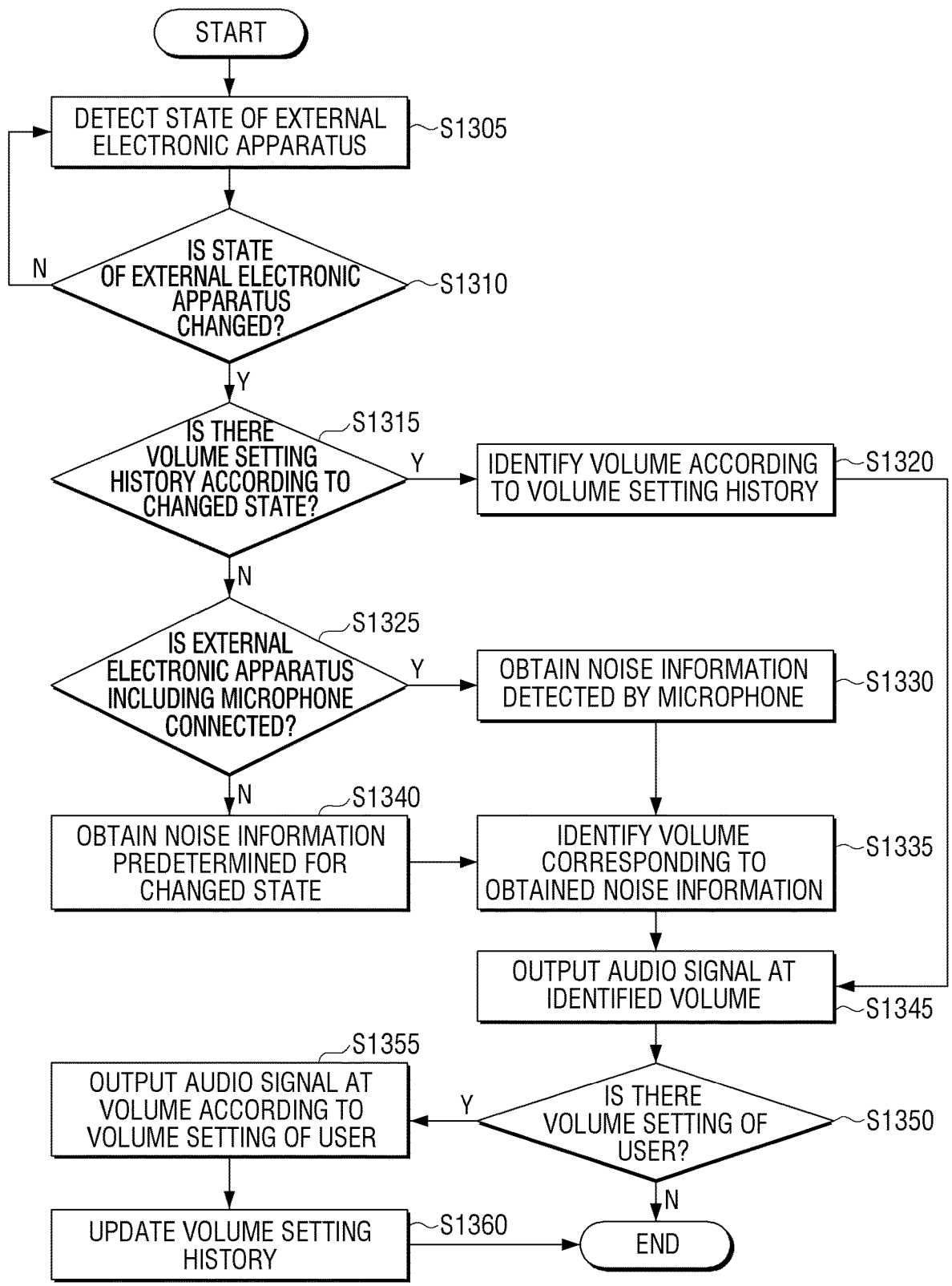
FIG. 13 illustrates an algorithm for explaining an example of a specific process of using both communication with the external electronic apparatus including the microphone and volume setting history stored in advance in the control method according to an embodiment.

FIG. 13 illustrates an algorithm for explaining an example of a specific process of using both communication with the external electronic apparatus including the microphone and the volume setting history stored in advance in the control method according to an embodiment.

Referring to FIG. 13, in the control method, a state of the external electronic apparatus is detected through state information received from the external electronic apparatus (S1305), and if it is determined that the state of the external electronic apparatus is changed (S1310-Y), it may be determined whether or not there is a volume setting history according to the changed state (S1315).

If there is a volume setting history according to the changed state (S1315-Y), the volume according to the volume setting history may be identified (S1320). Specifically, a volume finally set by a user when the external electronic apparatus was in the changed state described above in the past, may be identified by using the volume setting history.

On the other hand, if there is no volume setting history according to the changed state (S1315-N), it may be determined whether or not an external electronic apparatus including a microphone is connected to the electronic apparatus (S1325).

If the external electronic apparatus including the microphone is connected to the electronic apparatus (S1325-Y), noise information may be obtained by receiving data according to the detection result of the microphone (S1330). A volume corresponding to the obtained noise information may be identified (S1335). Specifically, a volume predetermined for the obtained noise information among the volumes predetermined for each noise information may be identified.

If the external electronic apparatus including the microphone is not connected (S1325-N), noise information predetermined for the changed state may be obtained (S1340). Then, the volume corresponding to the obtained noise information may be identified (S1335). Specifically, a volume predetermined for the obtained noise information among the volumes predetermined for each noise information may be identified.

In the control method, an audio signal of the content may be output at the identified volume (S1345).

In this case, if there is volume setting by a user (S1350-Y), the audio signal of the content may be output at a volume according to the volume setting of a user (S1355).

Then, the volume according to the volume setting of a user may be stored as a volume setting history of the changed state or the obtained noise information. In addition, the volume setting history stored in advance may be updated by adding the volume according to the volume setting of a user to the volume setting history stored in advance regarding the changed state or the obtained noise information (S1360).

The method for controlling the electronic apparatus described throughout FIGS. 10 to 13 may be implemented through the electronic apparatus 100 shown and described with reference to FIGS. 2 and 9.

In addition, the method for controlling the electronic apparatus described throughout FIGS. 10 to 13 may be implemented through a system including the electronic apparatus 100 and one or more external apparatus.

As described above, the electronic apparatus and the method for controlling thereof according to an embodiment may recognize ambient noise by using state information of neighboring apparatuses without providing a microphone in the apparatus, and automatically control a volume of an output sound with respect to the noise.

In addition, the electronic apparatus and the method for controlling thereof according to an embodiment are advantageous in terms of determining an optimal volume by using both an environment of IoT communication with neighboring apparatuses and information stored in advance, because it is also possible to automatically control the volume of the sound by additionally considering the volume setting history of a user or ambient noise information received via communication with an external electronic apparatus including a microphone.

The embodiments described above may be implemented in a recording medium readable by a computer or a similar device using software, hardware, or a combination thereof.

According to the implementation in terms of hardware, the embodiments may be implemented by using at least one of Application Specific Integrated Circuits (ASICs), digital signal processors (DSPs), digital signal processing devices (DSPDs), Programmable logic devices (PLDs), field programmable gate arrays (FPGAs), a processor, a controller, micro-controllers, a microprocessor, and an electrical unit for executing other functions.

In some cases, the embodiment described in this specification may be implemented as the processor 130 itself. According to the implementation in terms of software, the embodiments such as procedures and functions described in this specification may be implemented as separate software modules. Each of the software modules may execute one or more functions and operations described in this specification.

Computer instructions for executing processing operations by the electronic apparatus 100 according to the embodiments descried above may be stored in a non-transitory computer-readable medium. When the computer instructions stored in such a non-transitory computer-readable medium are executed by a processor of a specific machine, the computer instructions may enable the specific machine to execute the processing operations of the electronic apparatus 100 according to the embodiments described above.

The non-transitory computer-readable medium is not a medium storing data for a short period of time such as a register, a cache, or a memory, but means a medium that semi-permanently stores data and is readable by a machine. Specifically, the various applications or programs may be stored and provided in the non-transitory computer-readable medium such as a CD, a DVD, a hard disk, a Blu-ray disc, a USB, a memory card, and a ROM.

While certain embodiments have been particularly shown and described with reference to the drawings, the embodiments are provided for the purposes of illustration and it will be understood by one of ordinary skill in the art that various modifications and equivalent other embodiments may be made from the disclosure. Accordingly, the true technical scope of the disclosure is defined by the technical spirit of the appended claims.

What is claimed is:

1. An electronic apparatus configured to reproduce content, the electronic apparatus comprising:
   a communicator comprising circuitry;
   an audio output device; and
   a processor configured to:
   receive state information indicating a state of an external electronic apparatus located around the electronic apparatus, from the external electronic apparatus via the communicator,
   determine whether or not the state of the external electronic apparatus is changed based on the received state information,
   based on the state of the external electronic apparatus being changed, obtain noise information based on state information of the external electronic apparatus that corresponds to the changed state, and
   control the audio output device to output an audio signal of content based on a volume corresponding to the obtained noise information,
   wherein the processor is further configured to:
   determine whether or not there is another external electronic apparatus including a microphone around the electronic apparatus by using the communicator, and
   based on the determining that no another external electronic apparatus including the microphone exists around the electronic apparatus, obtain the noise information corresponding to the changed state among noise information that is predetermined for each state of the external electronic apparatus.

2. The electronic apparatus according to claim 1, wherein the processor is further configured to:
   based on the determining that the other external electronic apparatus including the microphone exists around the electronic apparatus, receive data regarding an audio signal detected by the microphone of the other external electronic apparatus from the other external electronic apparatus via the communicator, and
   obtain the noise information based on the received data.

3. The electronic apparatus according to claim 2, wherein the processor is further configured to obtain the noise information based on an audio signal excluding the audio signal of the content among audio signals corresponding to the received data.

4. The electronic apparatus according to claim 1, wherein the processor is configured to:
   determine whether or not a volume setting history of a user corresponding to the state of the external electronic apparatus exists based on the received state information, and
   based on the determining that the volume setting history corresponding to the state of the external electronic apparatus exists, control the audio output device to output the audio signal of the content at a volume according to the volume setting history.

5. The electronic apparatus according to claim 4, wherein the processor is further configured to;
   based on the determining that the volume setting history corresponding to the state of the external electronic apparatus exists, identify a volume finally set by the user while the external electronic apparatus was in the state in the past based on the volume setting history, and
   control the audio output device to output the audio signal of the content at the identified volume.

6. The electronic apparatus according to claim 4, wherein the processor is further configured to:
   based on the determining that no volume setting history corresponding to the state of the external electronic apparatus exists, control the audio output device to output the audio signal of the content based on a volume corresponding to the obtained noise information among volumes predetermined for each noise information.

7. The electronic apparatus according to claim 1, wherein the processor is further configured to:
   based on a volume corresponding to the obtained noise information being higher than a volume of the audio signal of the content output by the audio output device, control the audio output device to increase the volume of the audio signal of the output content, and
   based on the volume corresponding to the obtained noise information being lower than the volume of the audio signal of the content output by the audio output device, control the audio output device to decrease the volume of the audio signal of the output content.

8. The electronic apparatus according to claim 7, wherein the processor is further configured to:
   based on the volume corresponding to the obtained noise information being higher than the volume of the audio signal of the content output by the audio output device, extract an audio signal corresponding to a voice of an utterer among audio signals of the content, and
   control the audio output device to increase a volume of the extracted audio signal among the audio signals of the output content.

9. A method for controlling an electronic apparatus configured to reproduce content, the method comprising:
   receiving state information indicating a state of an external electronic apparatus located around the electronic apparatus, from the external electronic apparatus via a communicator;
   determining whether or not the state of the external electronic apparatus is changed based on the received state information;
   based on the state of the external electronic apparatus being changed, obtaining noise information based on state information of the external electronic apparatus that corresponds to the changed state; and
   outputting an audio signal of content based on a volume corresponding to the obtained noise information,
   wherein the obtaining the noise information further comprises:
   determining whether or not there is another external electronic apparatus including a microphone around the electronic apparatus by using the communicator, and
   based on the determining that no another external electronic apparatus including the microphone exists around the electronic apparatus, obtaining the noise information corresponding to the changed state among noise information that is predetermined for each state of the external electronic apparatus.

10. The method according to claim 9, wherein the obtaining the noise information further comprises:
    based on the determining that the other external electronic apparatus including the microphone exists around the electronic apparatus, receiving data regarding an audio signal detected by the microphone of the other external electronic apparatus from the other external electronic apparatus via the communicator; and
    obtaining the noise information based on the received data.

11. The method according to claim 10, the obtaining the noise information further comprises:
    obtaining the noise information based on an audio signal excluding the audio signal of the content among audio signals corresponding to the received data.

12. The method according to claim 9, the outputting the audio signal of the content further comprises:
    determining whether or not a volume setting history of a user corresponding to the state of the external electronic apparatus exists based on the received state information; and
    based on the determining that the volume setting history corresponding to the state of the external electronic apparatus exists, outputting the audio signal of the content at a volume according to the volume setting history.

13. The method according to claim 12, wherein the outputting the audio signal of the content further comprises:
    based on the determining that the volume setting history corresponding to the state of the external electronic apparatus exists, identifying a volume finally set by the user while the external electronic apparatus was in the state in the past based on the volume setting history; and
    outputting the audio signal of the content at the identified volume.

14. The method according to claim 12, wherein the outputting the audio signal of the content further comprises:
    based on the determining that no volume setting history corresponding to the state of the external electronic apparatus exists, outputting the audio signal of the content based on a volume corresponding to the obtained noise information among volumes predetermined for each noise information.

15. The method according to claim 9, wherein the outputting the audio signal of the content further comprises:
    based on a volume corresponding to the obtained noise information being higher than a volume of the audio signal of the content output by the electronic apparatus, increasing the volume of the audio signal of the output content; and based on the volume corresponding to the obtained noise information being lower than the volume of the audio signal of the content output by the electronic apparatus, decreasing the volume of the audio signal of the output content.

16. The method according to claim 15, wherein the outputting the audio signal of the content further comprises:
based on the volume corresponding to the obtained noise information being higher than the volume of the audio signal of the content output by the electronic apparatus, extracting an audio signal corresponding to a voice of an utterer among audio signals of the content, and
increasing a volume of the extracted audio signal among the audio signals of the output content.

* * * * *